United States Patent
Gong et al.

(10) Patent No.: US 11,631,462 B2
(45) Date of Patent: Apr. 18, 2023

(54) TEMPERATURE ASSISTED PROGRAMMING OF FLASH MEMORY FOR NEUROMORPHIC COMPUTING

(71) Applicant: INTERNATIONAL BUSINESS MACHINES CORPORATION, Armonk, NY (US)

(72) Inventors: Nanbo Gong, White Plains, NY (US); Takashi Ando, Eastchester, NY (US); Bahman Hekmatshoartabari, White Plains, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 426 days.

(21) Appl. No.: 16/785,797

(22) Filed: Feb. 10, 2020

(65) Prior Publication Data

US 2021/0249081 A1     Aug. 12, 2021

(51) Int. Cl.
| | |
|---|---|
| *G11C 11/34* | (2006.01) |
| *G11C 16/10* | (2006.01) |
| *G11C 16/26* | (2006.01) |
| *H01L 27/11521* | (2017.01) |
| *G06N 3/063* | (2023.01) |
| *H01L 29/40* | (2006.01) |
| *H01L 29/423* | (2006.01) |

(Continued)

(52) U.S. Cl.
CPC .............. *G11C 16/10* (2013.01); *G06N 3/063* (2013.01); *G06N 3/08* (2013.01); *G11C 16/26* (2013.01); *H01L 27/11521* (2013.01); *H01L 29/408* (2013.01); *H01L 29/42324* (2013.01); *H01L 29/7881* (2013.01)

(58) Field of Classification Search
CPC ... G11C 16/10; G11C 16/26; H01L 27/11521; H01L 29/408; H01L 29/42324; H01L 29/7881; G06N 3/063; G06N 3/08
USPC ........................................................ 365/211
See application file for complete search history.

(56) References Cited

U.S. PATENT DOCUMENTS

| | | |
|---|---|---|
| 6,009,033 A | 12/1999 | Li et al. |
| 6,944,057 B1 | 9/2005 | Runnion et al. |

(Continued)

FOREIGN PATENT DOCUMENTS

| KR | 20000043892 A | 7/2000 |
|---|---|---|

OTHER PUBLICATIONS

Twisha Titirsha et al, "Endurance-Aware Mapping of Spiking Neural Networks to Neuromorphic Hardware", Feb. 2022, IEEE Transactions on Parallel & Distributed Systems, vol. 33, No. 2 (Year: 2022).*

(Continued)

*Primary Examiner* — Viet Q Nguyen
(74) *Attorney, Agent, or Firm* — Tutunjian & Bitetto, P.C.; Randy Emilio Tejeda (57) ABSTRACT

A method is presented for temperature assisted programming of flash memory for neuromorphic computing. The method includes training a chip in an environment having a first temperature, adjusting the first temperature to a second temperature in the environment, and employing the chip for inference in the second temperature environment. The first temperature is about 125° C. or higher and the second temperature is about 50° C. or lower.

10 Claims, 5 Drawing Sheets

(51) Int. Cl.
*G06N 3/08* (2023.01)
*H01L 29/788* (2006.01)

(56) References Cited

U.S. PATENT DOCUMENTS

| | | | |
|---|---|---|---|
| 7,133,316 | B2 | 11/2006 | Lue |
| 7,295,478 | B2 | 11/2007 | Wan et al. |
| 7,457,146 | B2 * | 11/2008 | Philipp .............. G11C 13/0069 365/221 |
| 8,081,508 | B2 | 12/2011 | Kim et al. |
| 8,437,171 | B1 | 5/2013 | Gilbert |
| 9,305,650 | B2 | 4/2016 | Gopalakrishnan et al. |
| 10,678,449 | B2 * | 6/2020 | Scott, III .................. G11C 7/04 |
| 10,698,460 | B2 * | 6/2020 | Ping ..................... G11B 33/142 |
| 2009/0189215 | A1 | 7/2009 | Samanta |
| 2015/0236027 | A1 | 8/2015 | Gopalakrishnan et al. |
| 2018/0260007 | A1 * | 9/2018 | Ping ..................... G11B 33/142 |
| 2019/0227022 | A1 * | 7/2019 | Harley-Trochimczyk .................. A61B 5/01 |
| 2020/0041160 | A1 * | 2/2020 | Ko ..................... G05B 13/0265 |

OTHER PUBLICATIONS

A. Melianas et al, "Temperature-resilient solid-state organic artificial synapses for neuromorphic computing", 2022, Science Advances Magazine, vol. 6. No. 27. (Year: 2022).*

Twisha Titirsha et al, "Thermal-Aware Compilation of Spiking Neural Networks to Neuromorphic Hardware", Semantic Scholar articles, Oct. 2020. (Year: 2020).*

Ando et al, "Application of HfSiON to Deep-Trench Capacitors of Sub-45-nm-Node Embedded Dynamic Random-Access Memory", Japanese Journal of Applied Physics. vol. 45, No. 4S. Apr. 25, 2006. (pp. 3165-3169.).

Gokmen et al., "Acceleration of Deep Neural Network Training with Resistive Cross-Point Devices", Design Considerations. Frontiers in Neuroscience.vol. 10. Jul. 21, 2016. (pp. 1-19.).

Gong et al., "Signal and noise extraction from analog memory elements for neuromorphic computing", Nature Communications. vol. 9, No. 1. May 29, 2018. (pp. 1-8.).

Kim et al., "Analog CMOS-based Resistive Processing Unit for Deep Neural Network Training", 2017 IEEE 60th International Midwest Symposium on Circuits and Systems. Aug. 6, 2017. (pp. 422-425.).

David Paterson, "Flash Core Voltage Supply—Requirements and Considerations", Freescale Semiconductor Inc. Freescale.com. Document No. AN4758. Application Note. Jun. 2013. (pp. 1-10.).

Pavan, et al., "Flash Memory Cells—An Overview", Proceedings of the IEEE. vol. 85, No. 8. Aug. 1997. pp. 1248-1271.

Southwick III et al., "Limitations of Poole-Frenkel Conduction in Bilayer HfO2/SiO2MOS Devices", IEEE Transactions on Device and Materials Reliability. vol. 10, No. 2. Jun. 2010. (pp. 201-207.).

* cited by examiner

TEMPERATURE ASSISTED PROGRAMMING OF FLASH MEMORY FOR NEUROMORPHIC COMPUTING

BACKGROUND

The present invention relates generally to flash memory, and more specifically, to temperature assisted programming of flash memory for neuromorphic computing.

Neuromorphic systems, also referred to as artificial neural networks, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems can include various electronic circuits that model biological neurons.

SUMMARY

In accordance with an embodiment, a method is provided for temperature assisted programming and reading of flash memory for neuromorphic computing. The method includes training a chip in an environment having a first temperature, adjusting the first temperature to a second temperature in the environment, wherein the first temperature is higher than the second temperature, and employing the chip for inference in the second temperature environment.

In accordance with another embodiment, a method is provided for reducing operating voltage during programming and/or speeding up programming, and maintaining long retention during operation of flash memory for neuromorphic computing as well as in standby (idle) conditions. The method includes employing a first temperature in an environment during training and employing a second temperature in the environment during inference, wherein the first temperature is higher than the second temperature.

In accordance with yet another embodiment, a structure for temperature assisted programming of flash memory for neuromorphic computing is provided. The structure includes a channel region having a conductivity type and adjoining an electrically insulating substrate, a structurally defective high-k tunneling dielectric layer with an equivalent oxide thickness (EOT) of 3-5 nm disposed over the insulating substrate, and a floating gate for storing carriers from the channel region. Increasing the temperature enhances carrier transport through the structurally defective high-k tunneling dielectric thus facilitating the programming of the flash memory.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for temperature assisted training of neural networks for neuromorphic computing. The temperature assisted training is enabled by temperature assisted programming of flash memory devices including structurally defective tunnel dielectrics. In one or more embodiments, the temperature assisted programming reduces the operation voltage for a given training time. In one or more embodiments, the temperature assisted programming reduces the training time for a given operation voltage.

In flash memories, a single cell can be electrically programmable and a large number of cells are electrically erasable at the same time. Flash memory implementations are divided into NAND and NOR implementations. In general, flash memories employ a floating-gate transistor. The two approaches indicate how the transistors are connected and used rather than incorporating the transistors as part of digital logic as with a field programmable gate array (FPGA) or custom logic. NOR flash transistors are connected to ground and a bit line, enabling individual bits to be accessed. NOR flash provides better write endurance than NAND flash. NOR flash is usually employed where code and data can exist. Microcontrollers with on-chip flash normally incorporate NOR flash. NAND flash transistors are generally connected in groups to a word line. This allows a higher density than NOR flash. NAND flash is usually employed for block-oriented data storage. NAND flash can be less reliable than NOR from a transistor standpoint, so error detection and correction hardware or software is part of NAND storage platforms. NAND is usually employed for high-capacity data storage.

The exemplary embodiments of the present invention further employ a temperature assisted approach to reduce programming voltage in training and employ normal operation temperatures for inference. The exemplary structure includes a structurally defective high-k dielectric with an equivalent oxide thickness (EOT) of 3-5 nm. The high-k dielectric can further include a high carbon concentration to increase the density of structural defects (e.g., traps) within the high-k dielectric, thus facilitating thermally-enhanced carrier transport (e.g., Frenkel-Poole conduction via traps) through the high-k dielectric. The high carbon concentration can be, e.g., greater than $10^{20}$ atoms/cm$^3$. In another example, a high temperature environment is provided (e.g., 125° C. or higher), a chip is trained, the temperature is lowered to normal (e.g. room temperature), and the chip is then used for inference in the normal temperature environment. As a result, the flash memory can be operated effectively for both training and inference.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, Ge is used in combination with TiN. However, other combinations of materials can be readily contemplated.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
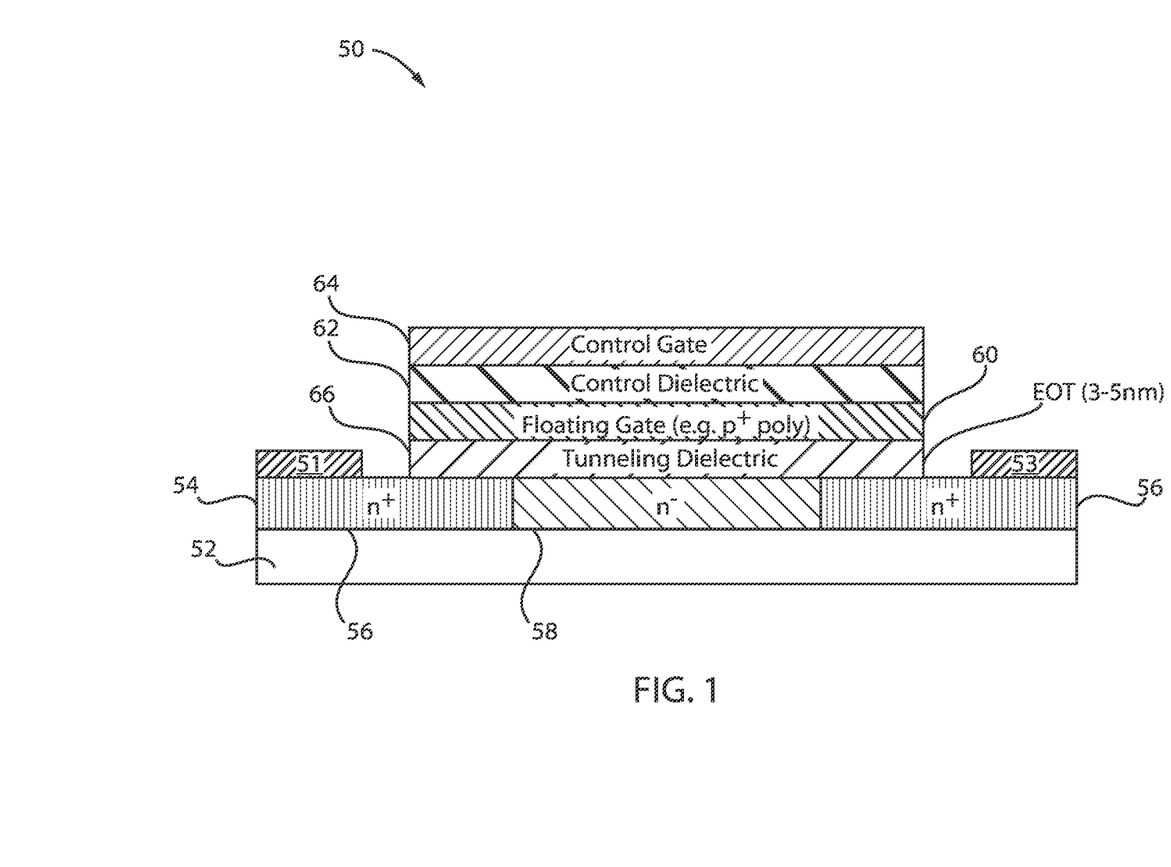
FIG. 1 is a cross-sectional view of an exemplary floating gate memory switch, in accordance with an embodiment of the present invention.

FIG. 1 is a cross-sectional view of an exemplary floating gate memory switch, in accordance with an embodiment of the present invention.

An exemplary device 50 designed to function as a "normally on" transistor structure is shown. It will be appreciated that "normally off" transistors can also be utilized in some embodiments. The device 50 includes an electrically insulating layer 52 such as a buried oxide (BOX) layer. Silicon dioxide is among the materials from which the insulating layer can be formed. A semiconductor layer 54 including highly doped source and drain regions 56 and a channel region 58 adjoin the electrically insulating layer 52. The source and drain regions have the same conductivity type as the substrate semiconductor layer 54. In one or more exemplary embodiments, the source and drain regions 56 are n+ (highly doped) and the channel region 58 is n− (of lesser doping concentration).

In embodiments employing silicon-based channel regions, n-type doping is preferable to p-type doping due to higher electron mobility than hole mobility in silicon. Low "on" resistance is thereby obtained. A drain electrode 51 is formed directly on one of the regions 56 and a source electrode 53 is formed directly on the other of the regions 56. The semiconductor layer 54 is formed from laser-crystallized polysilicon in some exemplary embodiments.

A floating gate 60 is coupled to the channel region 58 through a tunneling dielectric layer 66. The floating gate 60 can be a highly doped p+ polysilicon layer in some embodiments. Other highly doped semiconductor materials can alternatively be employed to form the floating gate 60. Poly-Ge, poly-SiGe, and metal oxides are among the materials employed in one or more alternative embodiments. The floating gate 60 has a doping type opposite to that of the channel region 58 in one or more exemplary embodiments.

In exemplary embodiments, the tunneling dielectric layer 66 is a high-k dielectric layer such as hafnium oxide (HfO$_2$) having an equivalent oxide thickness (EOT) of about 3-5 nm. A high-k dielectric material is understood as having a high dielectric constant as compared to silicon dioxide. The EOT indicates how thick a silicon oxide film would need to be to produce the same effect as the high-k material being used. Materials having larger dielectric constants enable thicker films to be used while maintaining low operation voltages.

Examples of such high-k dielectrics include but are not limited to HfO$_2$, Al$_2$O$_3$, SrTiO$_3$, PbTiO$_3$, TiO$_2$, BaZrO$_3$, PbZrO$_3$, Ta$_2$O$_5$, SrBi$_2$Ta$_2$O$_9$, ZrO$_2$, ZrSiO$_4$, HfSiO$_4$.

A gate dielectric layer 62 such as a high-k dielectric layer adjoins the opposite side of the floating gate 60. A gate electrode 64 adjoins the gate dielectric layer 62 and is functional as a control gate, as described further below. The floating gate 60 is coupled to the control gate electrode 64 through the gate dielectric layer 62.

Prior to programming, the exemplary device 50 is normally on. No gate bias is needed for performing a read function. However, a designated gate voltage can be used if desired. A normally-on device refers to preferably no depletion (accumulation or flat-band condition) or alternatively only a partial depletion of the channel at zero control gate bias.

A positive control gate bias is applied to perform a write function. Upon application of a positive bias to the control gate electrode 64 of the exemplary device 50, electrons tunnel into the floating gate 60 from the n+ and n− regions of the semiconductor layer 54 by tunneling through the high-k dielectric layer 62. In preferred embodiments, the high-k dielectric layer 62 has a high density of structural defects (e.g., traps) facilitating the transport of carriers (electrons in this example) through the high-k dielectric layer 62 by way of trap-assisted tunneling (also known as Frenkel-Poole emission). In some embodiments, the high-k dielectric layer 62 includes carbon-containing HfO$_2$ with a carbon (C) concentration greater than $10^{20}$ atoms/cm$^3$ to produce a large density of structural defects within the high-k dielectric layer 62. In some embodiments, the structural defects include oxygen vacancies.

In one or more embodiments, the high-k dielectric contains greater than $10^{19}$ structural defects/cm$^3$. In contrast to direct (e.g. band-to-band) tunneling or field-emission, which are independent of temperature to the first order, Frenkel-Poole emission is a thermally-activated process with strong temperature dependence.

A first order expression describing Frenkel-Poole emission is given by:

$$J \propto E \exp[-q(\phi_B - \sqrt{qE/(\pi\varepsilon)})/(KT)]$$

where J is the current density through the dielectric resulting from Frenkel-Poole emission, E is the electric field across the dielectric (equal to the voltage across the dielectric divided by the thickness of the dielectric), q is the elementary charge, $\phi_B$ is the barrier height associated with localization of defects (traps) at zero electric field (E=0), e.g., the voltage barrier that an electron must cross to tunnel from one localized state (trap) to another, s is the permittivity of the dielectric, K is the Boltzmann constant, and T is the absolute temperature.

As seen from the expression, current density through the dielectric (resulting from carrier transport via Frenkel-Poole emission) can be significantly enhanced by elevating the temperature. In one example, a high-temperature environment is provided (e.g., 125° C. or higher) during the programming of the exemplary device 50 (e.g., performing a write function by applying a positive gate voltage as described above) to enhance electron tunneling into the floating gate 60 by enhancing Frenkel-Poole emission. As a result, the operation voltage can be reduced for a given programming time, or the programming time can be reduced for a given operation voltage, by increasing the temperature. The electrons that have tunneled into the floating gate 60 are recombined with the majority holes in the floating gate 60, adding net negative charge to the floating gate 60. Addition of negative charge to the floating gate 60 reduces the channel conduction by reducing charge accumulation in the channel and/or increasing the depletion region width in the channel. A sufficiently high negative charge on the floating gate 60 turns off the device by fully depleting the channel.

After a "write" function is performed and the positive bias on the control gate is removed (or changed to, e.g., near-zero or a negative value), the electric field across the tunneling dielectric 62 is reduced to a small or near-zero value, reducing the Frenkel-Poole emission accordingly, thus allowing the floating gate 60 to effectively retain the stored negative charge. During inference or standby conditions, retention is further enhanced by reducing the environment temperature to, e.g., room temperature.

A negative control gate bias is employed for performing an "erase" function. The erase function involves tunneling of minority holes from the semiconductor layer 54 into the floating gate 60, and tunneling of the minority electrons out of the floating gate 60 into the semiconductor layer 54. Similar to a "write" operation, an "erase" operation is facilitated by increasing the temperature, as both tunneling currents are enhanced by the increase of Frenkel-Poole emission at increased temperatures.

As will be further explained below with respect to neuromorphic computing, a "write" operation during training as described above corresponds to synaptic depreciation, as a "write" operation reduces the channel conduction. In contrast, an "erase" operation during training as described above corresponds to synaptic potentiation, as an "erase" operation increases the channel conduction.

In one example embodiment, the exemplary device has dimensions of 1 μm×1 μm=$10^{-8}$ cm$^2$, and high-k tunnel dielectric thickness of 3-5 nm equivalent oxide thickness (EOT). A bias voltage of 1V can appear across the high-k dielectric 66, e.g., when the source and drain are connected to ground (0V), and the control gate is connected to a voltage larger than 1V (e.g., approximately 1.2-2V for a control dielectric thickness of 6-10 nm). This can occur, e.g., at the beginning of a "write" operation, resulting in a floating gate voltage of 1V and a channel voltage of 0V.

At room temperature and a bias voltage of 1V across the high-k dielectric 66, the leakage current density through the high-k dielectric 66 is of the order of $10^{-5}$ A/cm$^2$ or lower.

In another example, at an elevated temperature of 140° C. and bias voltage of 1V across the high-k dielectric 66, the current density through the high-k dielectric 66 (dominated by Frenkel-Poole conduction) is of the order of $10^{-3}$ A/cm$^2$.

This corresponds to a programming current of $10^{-3}$ A/cm$^2$×$10^{-8}$ cm$^2$=$10^{-11}$ A and a floating gate electric charge of the order of $10^{-15}$ C (assuming a floating gate voltage of 1V).

The time needed to store an electric charge of $10^{-18}$ C ($10^{-15}$ C/1000 training steps) on the floating gate is thus of the order of $10^{-18}$ C/$10^{-11}$ A=100 ns.

Therefore, a training step can be performed in a time span of the order of 100 ns.

In another example, at a temperature of 230° C. and a bias voltage of 1V across the high-k dielectric 66, the current density through the high-k dielectric 66 is of the order of $10^{-2}$ A/cm$^2$.

Therefore, the time needed to store an electric charge of $10^{-18}$ C on the floating gate is of the order of 10 ns and a training step can be performed in a time span of the order of 10 ns.

In yet another example where the tunnel dielectric and the control dielectric are 3-5 nm and 6-10 nm thick, respectively, the drain and the control gate are grounded (e.g., at 0V), and the stored charge on the floating gate is $10^{-15}$ C.

The floating gate potential is approximately 0.1V as expected from capacitive coupling between the channel, the floating gate, and the control gate.

In this exemplary embodiment, reducing the bias voltage across the high-k dielectric from 1V to 0.1V reduces Frenkel-Poole conduction, and, therefore, current density through the high-k dielectric is reduced by a factor of approximately $10^5$ and $10^{10}$ times at 230° C. and room-temperature, respectively. As a result, when the floating gate potential is 0.1V after a "write" operation or in standby, conduction through the high-k dielectric at 230° C. and room-temperature is approximately $10^5$ and $10^{10}$ times lower, respectively, compared to when the floating gate potential is 1V during a "write" operation (assuming grounded source and drain during and after a "write" operation or in standby).

For example, from $10^{-3}$ A/cm$^2$ to $10^{-8}$ A/cm$^2$ at 230° C., and from $10^{-5}$ A/cm$^2$ (and below) to $10^{-15}$ A/cm$^2$ (and below) at room temperature. This corresponds to a charge retention time of approximately 10 ms at 230° C., and 1000s (and above) at room temperature.

Figure 2:
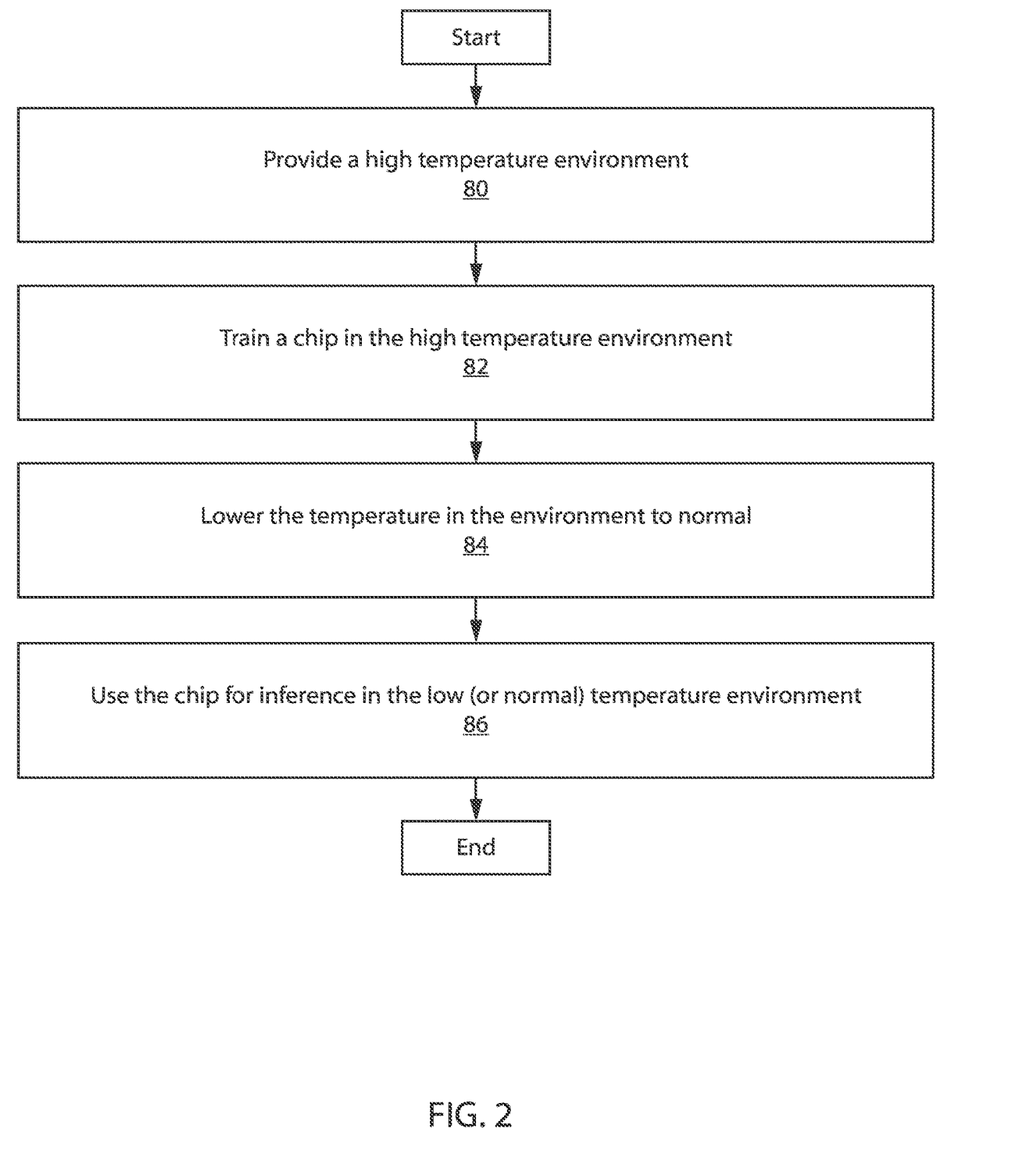
FIG. 2 is a block/flow diagram of an exemplary method for reducing operating voltage during training, in accordance with an embodiment of the present invention.

FIG. 2 is a block/flow diagram of an exemplary method for reducing operating voltage and/or training time during training, in accordance with an embodiment of the present invention.

At block 80, a high temperature environment is provided. The high temperature can be 125° C. or higher, where lower voltage is needed for the training.

At block 82, a chip is trained in the high temperature environment.

At block 84, the temperature in the environment is lowered to normal. The low temperature can be 50° C. or lower, where low leakage current and good retention characteristics are achieved.

At block 86, the chip is used for inference in the low (or normal) temperature environment. The temperature assisted programming enables lower operating voltage and/or accelerated training.

Figure 3:
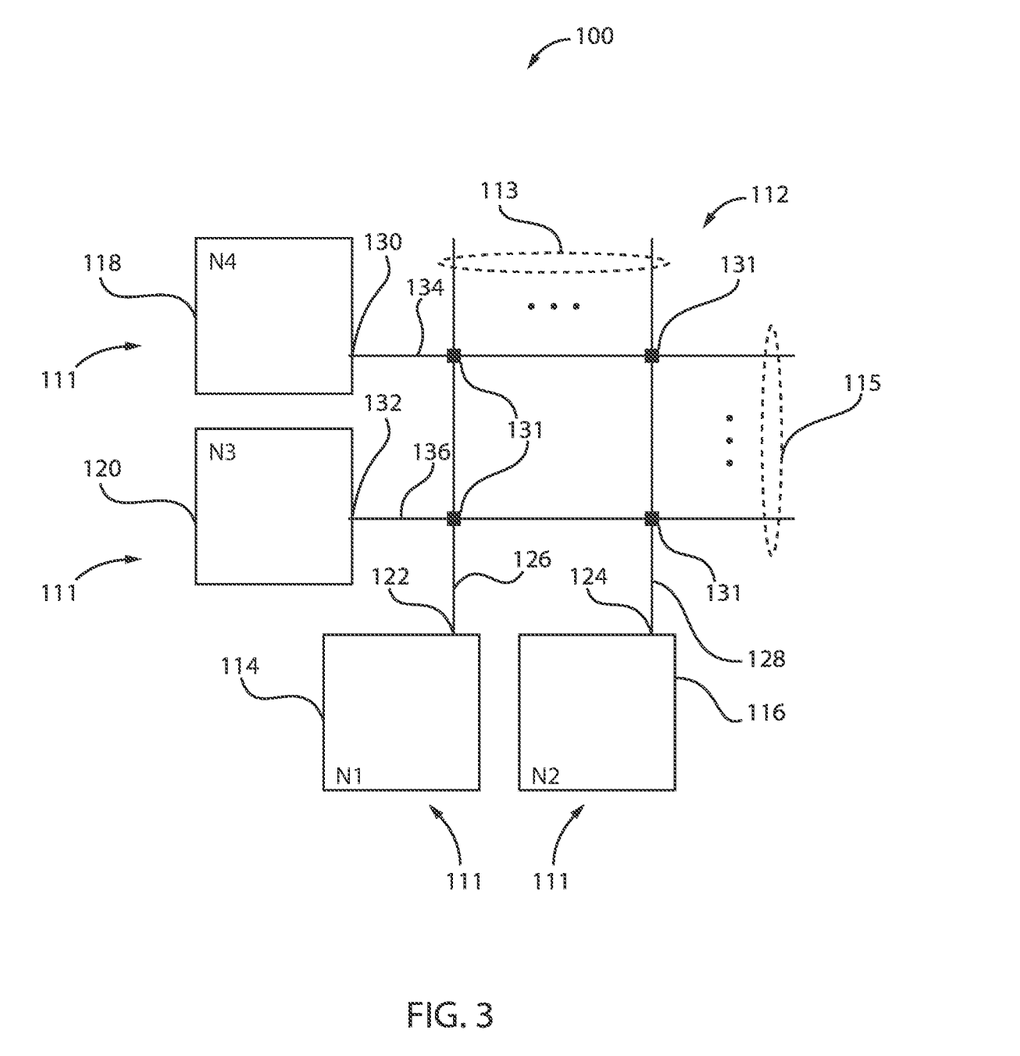
FIG. 3 is a block/flow diagram of an exemplary neuromorphic and synaptronic network including a crossbar of electronic synapses interconnecting electronic neurons and axons, in accordance with an embodiment of the present invention.

FIG. 3 is a block/flow diagram of an exemplary neuromorphic and synaptronic network including a crossbar of electronic synapses interconnecting electronic neurons and axons, in accordance with an embodiment of the present invention.

The example tile circuit 100 has a crossbar 112 in accordance with an embodiment of the invention. In one example, the overall circuit can include an "ultra-dense crossbar array" that can have a pitch in the range of about 0.1 nm to 10 μm. The neuromorphic and synaptronic circuit 100 includes the crossbar 112 interconnecting a plurality of digital neurons 111 including neurons 114, 116, 118 and 120.

These neurons 111 are also referred to herein as "electronic neurons." For illustration purposes, the example circuit 100 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 100, the neurons 111 are connected to the crossbar 112 via dendrite paths/wires (dendrites) 113 such as dendrites 126 and 128. Neurons 111 are also connected to the crossbar 112 via axon paths/wires (axons) 115 such as axons 134 and 136. Neurons 114 and 116 are dendritic neurons and neurons 118 and 120 are axonal neurons connected with axons 113. Specifically, neurons 114 and 116 are shown with outputs 122 and 124 connected to dendrites (e.g., bitlines) 126 and 128, respectively. Axonal neurons 118 and 120 are shown with outputs 130 and 132 connected to axons (e.g., wordlines or access lines) 134 and 136, respectively.

When any of the neurons 114, 116, 118 and 120 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 126, 128 and axons 134, 136 are made through a digital synapse device 131 (synapse). The junctions where the synapse devices are located can be referred to herein as "cross-point junctions." In general, in accordance with an embodiment of the invention, neurons 114 and 116 will "fire" (transmit a pulse) in response to the inputs they receive from axonal input connections (not shown) exceeding a threshold.

Neurons 118 and 120 will "fire" (transmit a pulse) in response to the inputs they receive from external input connections (not shown), usually from other neurons, exceeding a threshold. In one embodiment, when neurons 114 and 116 fire, they maintain a postsynaptic spike-timing-dependent plasticity (STDP) (post-STDP) variable that decays. For example, in one embodiment, the decay period can be 50 μs (which is 1000× shorter than that of actual biological systems, corresponding to 1000× higher operation speed). The post-STDP variable is employed to achieve STDP by encoding the time since the last firing of the associated neuron. Such STDP is used to control long-term potentiation or "potentiation," which in this context is defined as increasing synaptic conductance. When neurons 118, 120 fire they maintain a pre-STDP (presynaptic-STDP) variable that decays in a similar fashion as that of neurons 114 and 116.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 111 implemented using complementary metal oxide semiconductor (CMOS) logic gates receive spike inputs and integrate them. In one embodiment, the neurons 111 include comparator circuits that generate spikes when the integrated input exceeds a threshold. In one embodiment, synapses are implemented using flash memory cells, wherein each neuron 111 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons, though they can operate on a faster time scale (e.g., 1000×) than their biological counterparts in many useful embodiments. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 4:
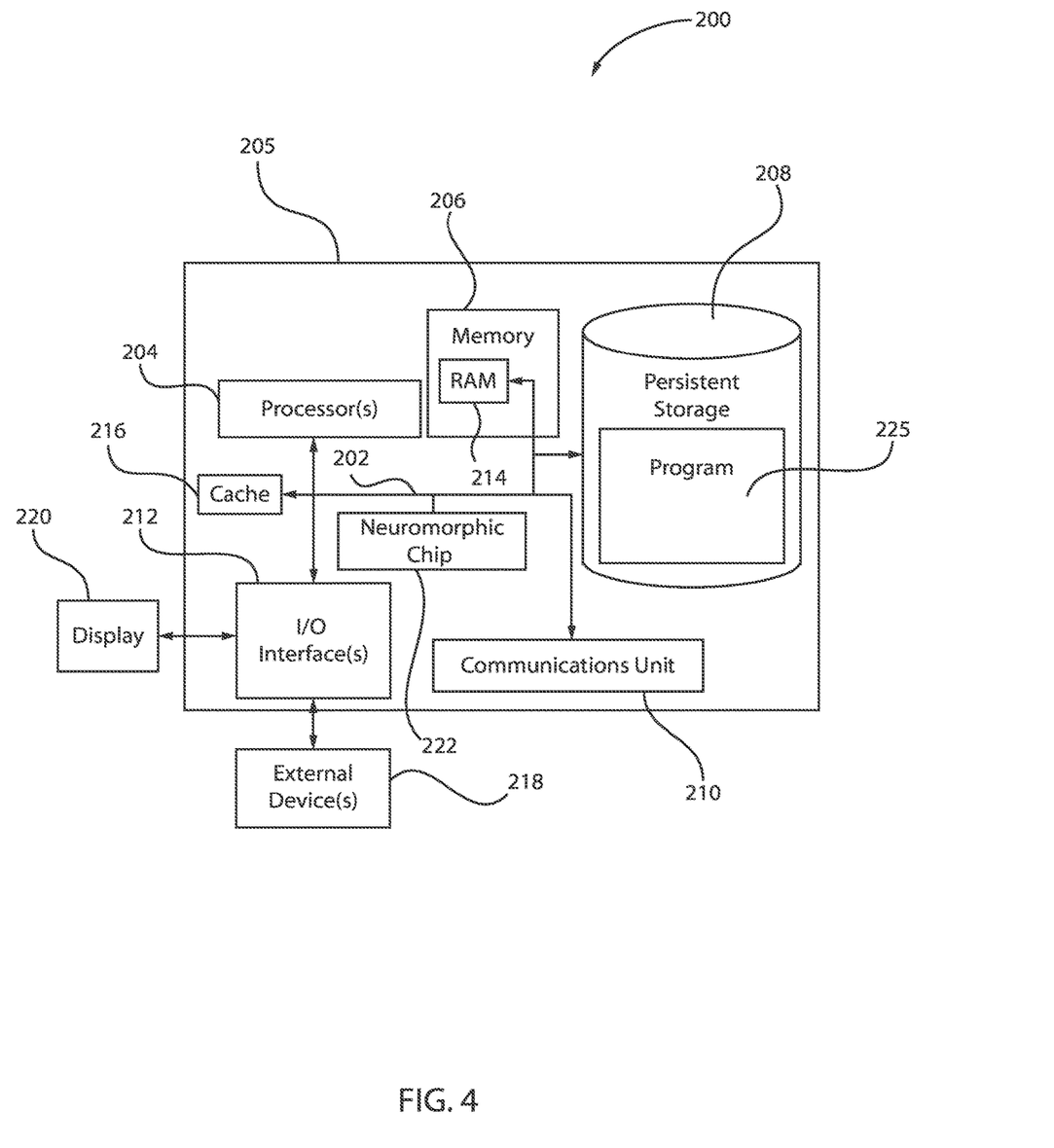
FIG. 4 depicts a block diagram of components of a computing system including a computing device and a neuromorphic chip capable of operationally performing temperature assisted programming, in accordance with an embodiment of the present invention.

FIG. 4 depicts a block diagram of components of a computing system including a computing device and a neuromorphic chip capable of operationally performing temperature assisted programming, in accordance with an embodiment of the present invention.

FIG. 4 depicts a block diagram of components of system 200, which includes computing device 205. It should be appreciated that FIG. 4 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In another embodiment, the memory 206 can be flash memory. In general, memory 206 can include any suitable volatile or non-volatile computer readable storage media.

In some embodiments of the present invention, deep learning program 225 is included and operated by neuromorphic chip 222 as a component of computing device 205. In other embodiments, deep learning program 225 is stored in persistent storage 208 for execution by neuromorphic chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Deep learning program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

Figure 5:
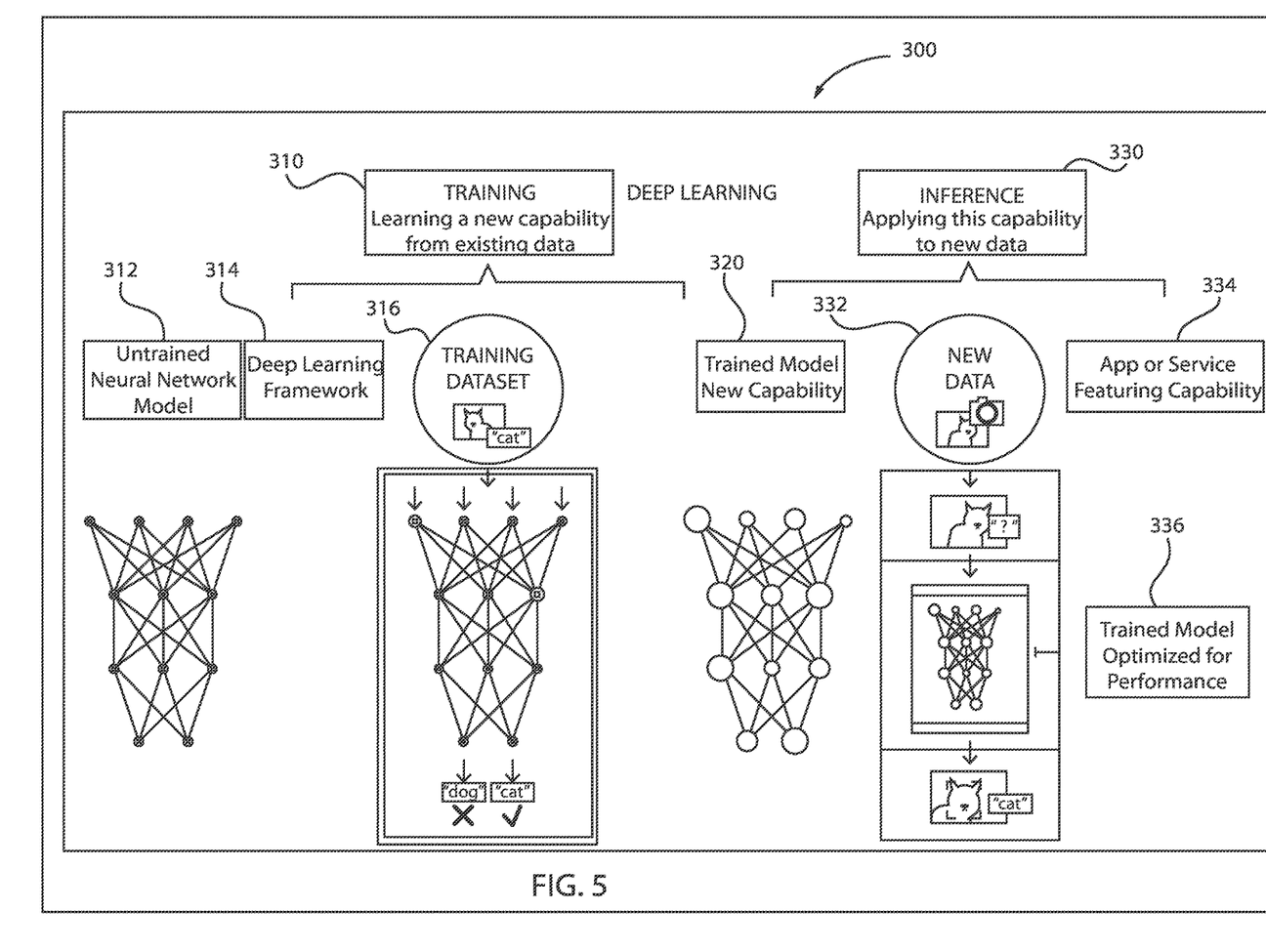
FIG. 5 illustrates deep learning training and inference employed for flash memory applications, in accordance with an embodiment of the present invention.

FIG. 5 illustrates deep learning training and inference employed for flash memory applications, in accordance with an embodiment of the present invention.

A deep learning system 300 includes training 310 and inference 330. Deep learning is a branch of machine learning in which models (e.g., neural networks) are graphed like "deep" structures with multiple layers. Deep learning is used to learn features and patterns that best represent data. Deep learning works in a hierarchical way, that is, the top layers learn high level generic features such as edges and the low level layers learn more data specific features. In FIG. 5, an untrained neural network model 312 is shown. The process of deep learning can be applied to various applications including image classification, text classification, speech recognition, and predicting time series data.

Training refers to the process of creating a machine learning model. Training involves the use of a deep-learning framework 314 and training dataset 316. A trained neural network 320 is put to work by using what the trained neural network has learned, that is, to recognize images, spoken words, etc., in the streamlined form of an application. This speedier and more efficient version of a neural network infers things about new data it is presented with based on its training. In the artificial intelligence (AI) terminology, this is known as "inference." Inference 330 refers to the process of using a trained machine learning algorithm to make a prediction. Inference 330 takes the new data 332 to create a trained model 336 for optimized performance. Inference 330 can also include an app or service featuring capability 334.

Neural networks are loosely modeled on the biology of our brains. Unlike our brains, where any neuron can connect to any other neuron within a certain physical distance, artificial neural networks have separate layers, connections, and directions of data propagation. When training a neural network, training data is fed into the first layer of the network, and individual neurons assign weightings to various connections within the neural network, based on the task being performed. In an image recognition network, the first layer might look for edges. The next might look for how these edges form shapes, such as rectangles or circles. The third might look for particular features, such as eyes and noses. Each layer passes the processed data to the next, until the final layer and the final output determined by the total of the weightings produced. This is referred to as the forward pass. In the widely-used backpropagation algorithm, the output predicted by the network in each training step is compared against the desired output, and the calculated prediction error is propagated backwards through the network layers and used for updating the weightings as to minimize the prediction error.

After training 310 is completed, the networks are deployed into the field for "inference," which is classifying data to "infer" a result. Consequently, inference is the stage in which a trained model is used to infer/predict the testing samples and includes a similar forward pass as training to predict the values. Unlike training 310, inference 330 does not include a backward pass to compute the error and update weights.

The exemplary embodiments of the present invention employ flash memory, and in particular, temperature assisted programming of flash memory to enable operation of flash memory for training and inference in neuromorphic computing. The temperature assisted approach reduces programming voltage (for a given training time) and/or speeds up the training (for a given programming voltage) in the training of the neural network, and allows for switching to a lower temperature (e.g., room temperature) for the inference. As a result, the deep learning system 300 of FIG. 5 can be trained and utilized effectively with optimum operation conditions by employing temperature assisted programming of flash memory described herein.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIG. 1. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for temperature assisted programming of flash memory for neuromorphic computing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method comprising:
    training a chip in an environment having a first temperature;
    adjusting the first temperature to a second temperature in the environment and applying a voltage to enhance electron tunneling into a floating gate of the chip; and
    employing the chip for inference in the second temperature environment, wherein the first temperature is higher than the second temperature.

2. The method of claim 1, wherein the first temperature is about 125° C. or higher.

3. The method of claim 2, wherein the second temperature is about 50° C. or lower.

4. The method of claim 1, wherein the chip includes charge-based memory.

5. The method of claim 4, wherein the charge-based memory is flash memory.

6. The method of claim 1, wherein a training time is reduced for a predetermined operation voltage.

7. The method of claim 1, wherein operating voltage is reduced during the training.

8. A method for reducing operating voltage during programming and maintaining long retention during reading and standby of flash memory for neuromorphic computing, the method comprising:
    employing a first temperature in an environment during training of a chip; and
    employing a second temperature in the environment during inference and applying a voltage to enhance electron tunneling into a floating gate of the chip, wherein the first temperature is higher than the second temperature.

9. The method of claim 8, wherein the first temperature is about 125° C. or higher.

10. The method of claim 9, wherein the second temperature is about 50° C. or lower.

* * * * *